Figure 1:
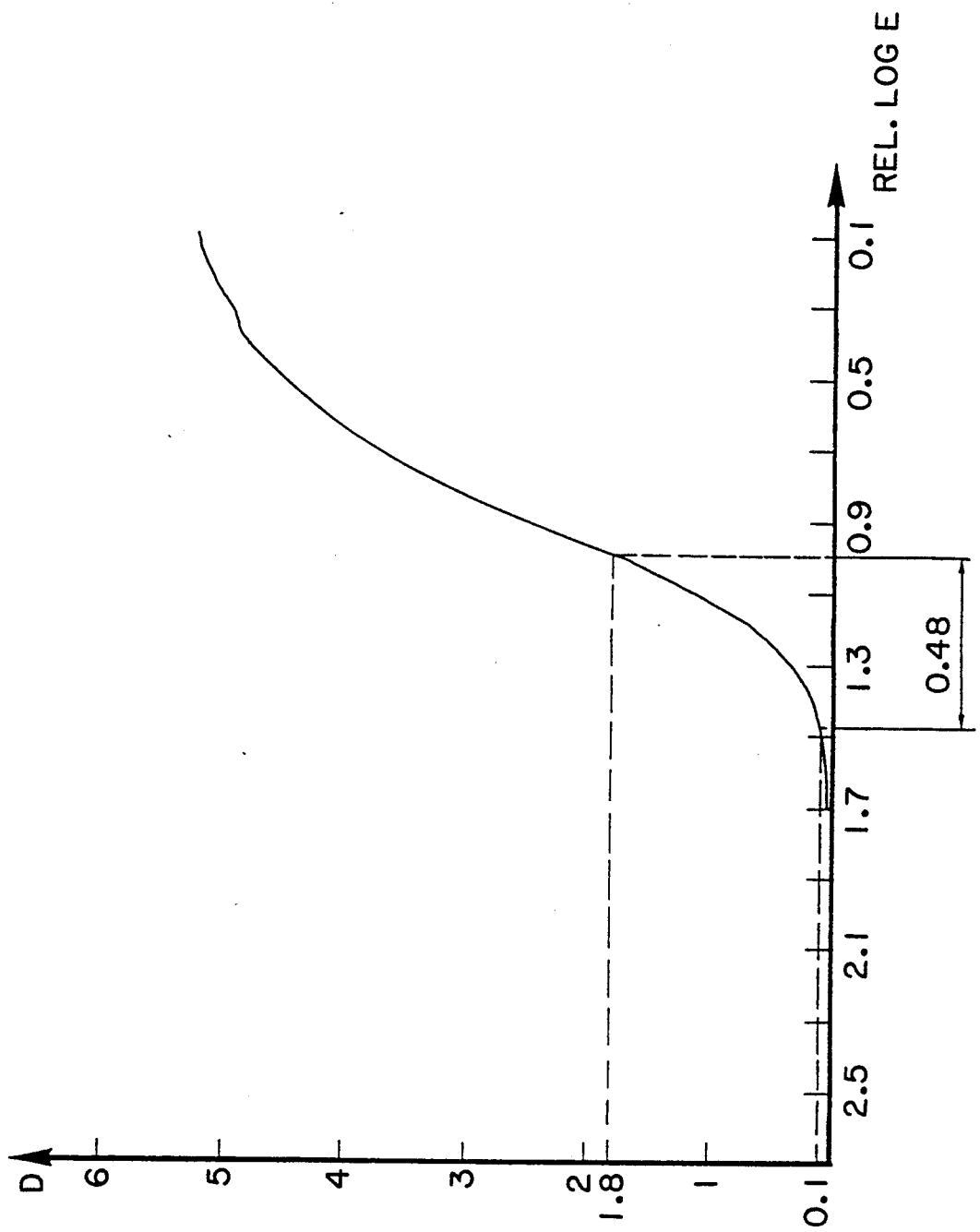

United States Patent [19]

Carleer et al.

[11] Patent Number: 4,997,733

[45] Date of Patent: Mar. 5, 1991

[54] PROCESS FOR THE PRODUCTION OF PHOTOGRAPHIC MASKS

[75] Inventors: Louis N. Carleer, Duffel; Pierre H. Nys, Berchem; Rudy F. Soetens, Wilrijk, all of Belgium

[73] Assignee: AGFA-Gevaert, N.V., Mortsel, Belgium

[21] Appl. No.: 308,032

[22] Filed: Feb. 9, 1989

[30] Foreign Application Priority Data

Feb. 17, 1988 [EP] European Pat. Off. ........ 88200273.6

[51] Int. Cl.$^5$ ................................................ G03F 9/00
[52] U.S. Cl. .......................................... 430/7; 430/4; 430/30; 430/396
[58] Field of Search .......................... 430/4, 7, 396, 30

[56] References Cited

U.S. PATENT DOCUMENTS 4,783,385 11/1988 Duesdieker ............................ 430/7

OTHER PUBLICATIONS

Research Disclosure #23135, pp. 254–256, Jul. 1983.

Primary Examiner—Jose Dees
Assistant Examiner—J. Weddington
Attorney, Agent, or Firm—William J. Daniel

[57] ABSTRACT

Process for the production of a photographic mask for tonal correction by dry dot etching wherein the selection of a particular halftone color separation image or overlaying registering combination of halftone color separation images used in a known process of mask production is not determined on the basis of the subjective attribute of color, i.e., hue, those areas to be color corrected, but is determined on the basis of optical density differences in at least one such halftone color separation, i.e., differences in contrast, between each area to be isolated as a substantially transparent area, and at least one particular background area surrounding each area to be isolated. The density differences can be compared between individual isolated areas and associated background areas directly or as the algebraic sums of such differences for a plurality of such areas. The calculation of the density differences and their comparison can be carried out by a computer.

12 Claims, 2 Drawing Sheets

PROCESS FOR THE PRODUCTION OF PHOTOGRAPHIC MASKS

FIELD OF THE INVENTION

The present invention relates to a process for the production of photographic masks for tonal correction by dry dot etching, and more particularly concerns the production of said masks for making dot size corrected halftone colour separation record suitable for the production of printing plates used for printing reproductions of coloured originals, in particular of colour photographs or colour art-work.

BACKGROUND OF THE INVENTION

In the preparation of photomechanical printing plates black-and-white halftone colour separation prints are used as photomasks in the production of printing plates for printing with subtractive colour printing inks. Inks of the subtractive colours cyan, magenta and yellow are used, as well as a certain amount of black ink applied by the black printer. Because of the overlapping spectral absorption bands of the subtractively coloured inks, the use of printing plates produced from photographic colour separation halftones without any correction usually results in poor quality colour reproduction. Accurate reproduction normally involves corrections for hue, saturation and lightness values. Apart from colour corrections necessary for faithful colour reproduction, colour modifications are often necessary for special effects, for example for purely aesthetic reasons or in order to achieve a heightened visual impact of selected matter in printed advertisements.

The amount and distribution pattern of any one of the printing inks in a multicolour print depends on the dot size distribution in the corresponding printing plate, which distribution in turn depends on the dot size distribution in the black-and-white halftone colour separation directly used in the making of the plate.

It is common practice to make a pre-press colour proof to evaluate the quality of the halftone colour separations. Suitable colour proofing processes for that purpose are described in e.g. GB-P 1,264,313, U.S. Pat. Nos. 4,701,401 and 4,553,835.

It is known to effect colour corrections or modifications by producing a contact-print of the initial halftone colour separation using an appropriately controlled exposure dose in an area to be dot-size corrected. A print wherein the dots in said area are smaller or larger than those of the initial separation can be produced, which print can then be directly used in making the corresponding printing plate. This technique for colour-correction or modification wherein dot-sizes are changed photographically and specifically in the areas where modification is required by controlled over-exposure or under-exposure is known in the art as "dry dot etching" or "dry etching" (see e.g. Research Disclosure July 1983 item 23135).

In dry dot etching for affecting a colour change in any selected area of an image, as determined for example from an examination of a colour proof, at least one isolation masks are made for use in combination with one or more of the initial halftone separations when making the aforesaid contact prints. If colour change is required in an area of simple shape, a suitable mask can be produced from a so-called cut-and-peel film or by hand-lacquering a mask film (see e.g. DE-P 3 140 955.

For more complicated shapes it is much better to produce the mask photographically.

As described in the above mentioned Research Disclosure and likewise in published European Patent Application 0 244 241 a mask serving the purpose of dot size correction or modification in a single halftone colour separation is obtained photographically by making an overlay combination of several halftone separation positives and/or negatives so that on photographing that overlay on a photographic silver halide emulsion material having a transparent base the colours to be corrected appear transparent on the mask. In order to select the required separations for constituting the overlay sandwich use is made of a colour chart wherefrom for each colour to be identified as a transparent area in the final mask a set of maximum three overlay films is found that fulfill the requirement for mask production.

Since it is necessary to produce a transparent mask area free from any dot structure a diffuse exposure of said sandwich is applied, e.g. by using in contact exposure a more or less mat interlay film (diffusion sheet) between the selected halftone separations and the film wherein the mask has to be produced.

For example, the colour "red" is isolated by photographing accurately in register the cyan positive separation with the magenta and yellow negative separation images on a mask film. One or more light-diffusing sheets are arranged in conjunction with the halftone colour separations to suppress the halftone dot structure in the mask. The thus exposed and developed mask film provides light shielding except for in the red coloured areas, to be corrected or modified in dot size.

The actual tonal correction takes place, in that the colour separation to be corrected is copied alone using a first exposure and is copied in combination with the mask onto a suitable halftone reproduction type film, i.e. a film having a very steep gradation characteristic yielding sharp screen dot reproduction.

The above method of mask production is well suited for the correction of tonal values of relatively pure colours that are easily identifyable but fails when non-pure colours, so-called tertiary colours formed by a mixture of all three basic primary colours (red, green and blue), such as brownish have to be isolated and corrected.

Since it is not uncommon for colour corrections or modifications to be required in several distinct areas of a halftone separation image and the production of separate masks for each area is a very time consuming job it would be particularly advantageous if all areas to be corrected against their backgrounds could be isolated in a one-step overlay procedure.

OBJECTS OF THE INVENTION

It is an object of the present invention to provide a process for the production of photographic masks for tonal correction by dry dot etching wherein the selection of a particular halftone colour separation image or overlay combination of halftone colour separation images in mask production is not determined on the basis of the subjective attribute of colour, i.e. hue, in each area to be colour corrected, but is rather determined on the basis of optical density differences in the halftone colour separation, i.e. differences in contrast, between each area to be isolated as a substantially transparent area, called herein also an isolation area, and (each) particular background area surrounding the area to be isolated.

It is a further object of the present invention to make the execution of this process very accurate, convenient and less time consuming by making the necessary computations with a computing machine programmed with software that contains the appropriate algorithm for making a proper selection of halftone separation images in mask formation.

Other objects and advantages of the present invention will appear from the further description and examples that are given for illustrative purpose.

SUMMARY OF THE INVENTION

According to the present invention there is provided an improvement in a process for the production of photographic masks for tonal correction by dry dot etching, which comprises the steps of:

(1) exposing a silver halide emulsion mask film material called mask material, called mask behind at least one black-and-white halftone colour separation reproduction, either positive and/or negative, in overlaying relation in accurate registration, said exposure being a contact exposure including in combination with said halftone colour separation at least one light-diffusion sheet to produce a mask in which the transparent area(s) is (are) free from dot structure, and (2) developing the thus exposed mask film, such improvement being characterized in that prior to steps (1) and (2) above, (i) in different halftone separation images selected from the group consisting of negative and positive cyan, magenta, yellow and optionally black printer separation images, of the same multicolour original, the integral optical density is measured in each area to be isolated as a substantially transparent area in the mask film in order to be corrected or modified in dot size, and also in at least one particular background area, (ii) the difference is calculated between the integral optical density measured in each of said areas to be isolated and the integral density measured in said at least one particular background area.

(iii) the density difference values obtained in each halftone colour separation image between either only one area to be isolated and said at least one particular background area are compared directly or the density differences obtained between one or more of the areas to be isolated and said at least one particular background area are added to obtain an algebraic sum of density difference values and the obtained values are compared to find the halftone colour separation image corresponding with the largest absolute value of said density differences or to find a combination of different halftone separation images corresponding with the largest absolute value obtained by the sum of said density differences, (iv) applying the thus found halftone colour separation image solely or a set of at least two of said identical images or the combination of said different halftone separation images in the exposure of step (1) for exposing therethrough the mask film, provided that said density difference or algebraic sum of density differences corresponding with the respective halftone separation images used in said exposure is sufficiently high that the numeral (numerical) value of said difference or sum of differences is not lower than ⅓ of the numerical value of the relative log exposure value range corresponding with the optical density range value between optical density 0.1 to 1.8 in the gradation curve obtained by plotting optical density (D) versus relative log exposure (rel.log E) that is obtained by exposure of the applied mask film through a continuous tone wedge and by development under the same conditions as in the above step (2).

By "integral optical density" measured on an halftone separation image is meant that in said image built up by dots of different size, the integral optical density of a surface area corresponding with a spot of 2 to 3 mm in diameter is measured by a spot densitometer.

According to a preferred embodiment the obtained numeral value of said density difference or algebraic sum of density differences is not lower than the numeral value of said exposure value range.

Figure 2:
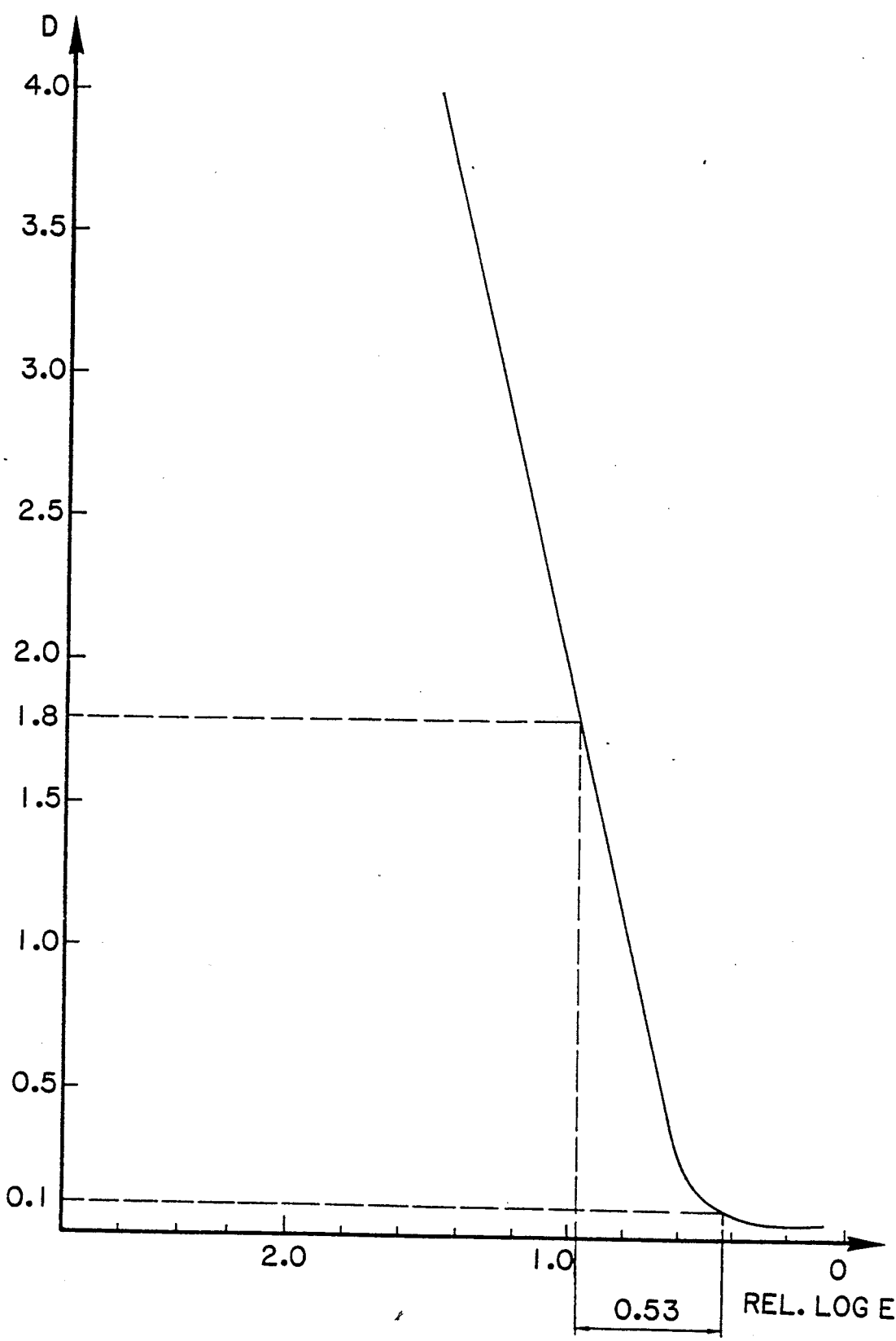

In the accompanying drawings FIGS. 1 and 2 represent gradation curves of mask films used in the Examples, wherein either a mask film with negative working silver halide emulsion or a mask film with direct positive working silver halide emulsion having exposure ranges of 0.48 and 0.53 respectively which as defined above correspond with an optical density range 0.1 to 1.8.

According to a modified embodiment which may be applied when the colour of any area to be isolated or the colour of the associated background area is easily identifiable by the skilled lithographer because the colours involved are relatively pure colours, no density measurement for the obtaining of integral density and corresponding % dot value need be made and instead use is made of a visual assessment identifying the pure colours (green, cyan, blue, magenta, red, yellow) and the lightness tones (highlight tones, middle tones and shadow tones) and giving them dot % values taken from the following tables A and B. In table A these colours and lightness values are identified by combinations of % dot in the cyan printer separation, magenta printer separation and yellow printer separation since no black printer separation is considered in making the photographic mask. In table B combinations of % dot value in the cyan printer separation, magenta printer separation, yellow printer separation and black printer separation are mentioned for the above defined colours and lightness values. So, tables A and B are practical work guides for correlating said pure colours and lightness values with percentage dot areas, also called % dot values in the halftone separation images. Only the colours that are not measured with the spot densitometer either in the isolation area(s) or background area(s) are defined by means of the % dot values given in said tables A or B. On using these tables A and B at least one integrated density measurement is still carried out in either an area to be isolated or in a background area.

TABLE A

| | Kind of halftone separation % dot value | | |
|---|---|---|---|
| | cyan | magenta | yellow |
| Identifyable colour | | | |
| Green | 91% | 9% | 91% |
| Cyan | 91% | 9% | 9% |
| Blue | 91% | 91% | 9% |
| Magenta | 9% | 91% | 9% |
| Red | 9% | 91% | 91% |
| Yellow | 9% | 9% | 91% |
| Identifyable lightness | | | |
| highlight tone | 9% | 9% | 9% |
| middle tone | 58% | 58% | 58% |
| shadow tone | 91% | 91% | 91% |

TABLE B

| | Kind of halftone separation % dot value | | | |
|---|---|---|---|---|
| | cyan | magenta | yellow | black |
| Identifyable colour | | | | |
| Green | 77% | 13% | 77% | 54% |
| Cyan | 84% | 20% | 20% | 43% |
| Blue | 77% | 77% | 13% | 54% |
| Magenta | 20% | 84% | 20% | 43% |
| Red | 13% | 77% | 77% | 54% |
| Yellow | 20% | 20% | 84% | 43% |
| Identifyable lightness | | | | |
| highlight tone | 7% | 7% | 7% | 7% |
| middle tone | 36% | 36% | 36% | 36% |
| shadow tone | 72% | 72% | 72% | 72% |

The process of the present invention is particularly convenient for the production of a mask serving for different areas to be corrected by one single exposure through a particular halftone separation or an overlay combination of halftone colour separation images when the areas to be corrected are similar in hue and lightness value and also their surrounding background areas are similar in those respects and have sufficient contrast with respect to the areas to be isolated.

The density (D) in an area of a halftone separation image has a direct relationship with the percent dot value (% dot) according to the following two equations (1) and (2), wherein T stands for "transparency" which is the ratio of projected input light on transmitted light in the selected area.

$$D = \frac{1}{\log T} \quad (1)$$

$$T = \frac{100 - \% \text{ dot}}{100} \quad (2)$$

Using the above equations (1) and (2) the spot densitometer measuring the integral densities as defined can be calibrated to give corresponding % dot values that may serve in the actual computation of the integral density values.

The conversion of integrated halftone density readings to percent dot area (% dot value) is given hereinafter in Table C for use in combination with the Examples given further on and constitutes part of the computer software algorithm in automated computation of a suitable selection of (a) halftone colour separation(s) used in the exposure of a particular mask film.

TABLE C

| Integrated Halftone Density | Percent Dot Area | Integrated Halftone Density | Percent Dot Area | Integrated Halftone Density | Percent Dot Area |
|---|---|---|---|---|---|
| 0.004 | 1 | 0.181 | 34 | 0.482 | 67 |
| 0.009 | 2 | 0.187 | 35 | 0.495 | 68 |
| 0.013 | 3 | 0.194 | 36 | 0.509 | 69 |
| 0.018 | 4 | 0.201 | 37 | 0.523 | 70 |
| 0.022 | 5 | 0.208 | 38 | 0.538 | 71 |
| 0.027 | 6 | 0.215 | 39 | 0.533 | 72 |
| 0.032 | 7 | 0.222 | 40 | 0.569 | 73 |
| 0.036 | 8 | 0.229 | 41 | 0.585 | 74 |
| 0.041 | 9 | 0.237 | 42 | 0.602 | 75 |
| 0.046 | 10 | 0.244 | 43 | 0.620 | 76 |
| 0.051 | 11 | 0.252 | 44 | 0.638 | 77 |
| 0.056 | 12 | 0.260 | 45 | 0.658 | 78 |
| 0.061 | 13 | 0.268 | 46 | 0.678 | 79 |
| 0.066 | 14 | 0.276 | 47 | 0.699 | 80 |
| 0.071 | 15 | 0.284 | 48 | 0.721 | 81 |
| 0.076 | 16 | 0.292 | 49 | 0.745 | 82 |
| 0.081 | 17 | 0.301 | 50 | 0.770 | 83 |

TABLE C-continued

| Integrated Halftone Density | Percent Dot Area | Integrated Halftone Density | Percent Dot Area | Integrated Halftone Density | Percent Dot Area |
|---|---|---|---|---|---|
| 0.086 | 18 | 0.310 | 51 | 0.796 | 84 |
| 0.092 | 19 | 0.319 | 52 | 0.824 | 85 |
| 0.097 | 20 | 0.328 | 53 | 0.854 | 86 |
| 0.102 | 21 | 0.337 | 54 | 0.886 | 87 |
| 0.108 | 22 | 0.347 | 55 | 0.921 | 88 |
| 0.114 | 23 | 0.357 | 56 | 0.959 | 89 |
| 0.119 | 24 | 0.366 | 57 | 1.000 | 90 |
| 0.125 | 25 | 0.377 | 58 | 1.046 | 91 |
| 0.131 | 26 | 0.387 | 59 | 1.097 | 92 |
| 0.137 | 27 | 0.398 | 60 | 1.155 | 93 |
| 0.143 | 28 | 0.409 | 61 | 1.222 | 94 |
| 0.149 | 29 | 0.420 | 62 | 1.301 | 95 |
| 0.155 | 30 | 0.432 | 63 | 1.398 | 96 |
| 0.161 | 31 | 0.444 | 64 | 1.522 | 97 |
| 0.168 | 32 | 0.456 | 65 | 1.699 | 98 |
| 0.174 | 33 | 0.468 | 66 | 2.000 | 99 |

In a preferred embodiment according to the present invention the selection of said halftone colour separation or overlay of halftone separations in the exposure of the mask film is determined by a programmed computer.

Preferably an electronic computer operating in conjunction with a data memory device is used. In that way a fast and easy algebraic summation of the density differences and very fast comparison of the summation results is obtained selecting therewith an appropriate halftone separation or overlay combination of halftone separation images in conjunction with one or more diffusion sheets serving the purpose of creating at least one transparent area in a mask film for dot size correction or modification by dry dot etching of an halftone image.

In an example for the isolation of only one transparent area (isolation area) with respect to several background areas (B1, B2 ... Bn) the following calculation scheme (algorithm) is followed, wherein measured integral density values are used and wherein the density values of the same isolation area (I) in each halftone colour separation image are denoted: $D_{Ic}$, $D_{Im}$, and $D_{Iy}$ for the cyan printer, magenta printer and yellow separation respectively. The differences are indicated by Delta values.

| Measured integral density values | | | Differences |
|---|---|---|---|
| $D_{Ic} -$ | $D_{B1c}$ | = | $\Delta D_{1c}$ |
| $D_{Ic} -$ | $D_{B2c}$ | = | $\Delta D_{2c}$ |
| . | . | | . |
| . | . | | . |
| . | . | | . |
| $D_{Ic} -$ | $D_{Bnc}$ | = | $\Delta D_{nc}$ (in cyan printer halftone image) |
| | $\sum_{i=1}^{n}$ | | $\Delta D_{ic}$ (summation) |
| $D_{Im} -$ | $D_{B1m}$ | = | $\Delta D_{1m}$ |
| $D_{Im} -$ | $D_{B2m}$ | = | $\Delta D_{2m}$ |
| . | . | | . |
| . | . | | . |
| . | . | | . |
| $D_{Im} -$ | $D_{Bnm}$ | = | $\Delta D_{nm}$ (in magenta printer halftone image) |
| | $\sum_{i=1}^{n}$ | | $\Delta D_{im}$ (summation) |
| $D_{Iy} -$ | $D_{B1y}$ | = | $\Delta D_{1y}$ |
| $D_{Iy} -$ | $D_{B2y}$ | = | $\Delta D_{2y}$ |
| . | . | | . |
| . | . | | . |

| Measured integral density values | Differences |
|---|---|
| -continued | |
| $D_{Iy} - D_{Bny}$ = | $\Delta D_{ny}$ (in yellow printer halftone image) |
| | $\sum_{i=1}^{n} \Delta D_{iy}$ (summation) |

The above procedure is applied for the negative as well as for the positive halftone separations.

The optical density differences (Delta values) are added and compared to find out which algebric sum gives the largest absolute value, and the halftone image corresponding with the largest absolute value of the algebraic sum of differences is selected for use in the exposure of the mask film.

The obtained mask density in the exposed and developed mask film in the opaque background area(s) should preferably be at least 1.8 and the density difference between "transparent" isolation area(s) of the mask and its "opaque" background area(s) should preferably be at least 0.45 and more preferably the density of the transparent area(s) should be not higher than 0.1.

If by applying only one halftone separation colour separation image or a particular set of halftone colour separation images (corresponding with the already defined highest density difference or highest sum of density differences) in the exposure of the mask film the mask result would still be unsatisfactory, e.g. in that a certain background area is still not opaque enough, an improvement can be obtained by combining in registration with the already applied halftone separation image(s) (a) further halftone separation image(s), optionally the same, increasing thereby the magnitude of the sum of differences of integral densities up to a value that is numerally not lower than ⅓ of the numeral value of the above already defined exposure range value of the mask film and preferably even higher than said numeral value.

So, in a particular case of selecting (a) halftone separation image(s) according to the present invention for mask formation, the desired area isolation will require as exemplified in Example 1 a combination of two of the same separation images to reach an improved contrast between an area to be isolated (isolation area) and a background area in the exposed and developed mask film.

In another particular case, an area has to be isolated against different background areas and in said case it has been found appropriate to combine a negative and positive of the same colour printer separation (see Example 3).

In the production of the mask the exposure is made on a mask film which is a photographic silver halide emulsion film material having a clear base, preferably a clear resin film base. Said film material incorporates either a negative working silver halide emulsion or a direct positive working silver halide emulsion. In order to avoid as much as possible the need for darkroom operating conditions preference is given to the use of so-called room light film, which is a film that can be handled in normal room light without fogging but is still sensitive enough for exposure in a contact-exposure camera with the usual light-sources. Examples of such films are described in Research Disclosure. March 1978, item 16,735 and in U.S. Pat. No. 2,219,667. Due to the absence of spectral sensitization those materials can be handled in bright yellow light without fogging.

The exposure of a mask film with negative working silver halide emulsion layer will require an overlay combination different from the one used in combination with a film with positive working silver halide emulsion layer not only because of image value reversal but also because of further differences in sensitometric properties. The combination giving the most contrasty mask, i.e. with the highest density differences between isolation area(s) and particular background area(s) is chosen.

The process can be entirely automated using a microprocessor or computer.

The information necessary for determining an appropriate exposure dose to be given to the mask film through the selected overlay combination (according to computer calculations) can be written in the form of a software program and fed to a computer which determines from the submitted data, including (1) the amount of overlay films, (2) integral density of each intended isolated area and integral density of each considered background area for all the halftone separation images in the overlay, (3) the presence of one or more diffusion sheets, (4) the film sensitivity, (5) the exposure characteristics (light source) of the exposure device and (6) sensitometric results resulting from processing conditions, the appropriate exposure time for obtaining the best isolation of substantially transparent parts of the mask from (a) sufficiently opaque background area(s).

Each lot of film may obtain an exposure factor calibrated with respect to the exposure apparatus and the sensitometric results obtained therewith under particular development processing conditions.

The exposure apparatus itself can incorporate a micro-processor chip which serves for direct exposure control in an electronic processing based on a software program as above referred to.

The invention is illustrated by the following examples without however limiting it thereto. The calculations have been carried out with the assistance of a computer.

EXAMPLE 1

From a multicolour transparency in the usual way positive halftone separation images corresponding with the cyan, magenta and yellow image content (halftone cyan printer, halftone magenta printer and halftone yellow printer images) were made. On the basis of a colour proof prepared therewith according to a wash-off technique described in U.S. Pat. No. 4,701,401 a particular area, called herein isolation area, was selected for dot size enlargement. In each of the obtained halftone selection images in that isolation area and in a particular background area the integral density was measured and expressed in % dot value. The obtained integral density measurement values in the positives and the therefrom derived integral density values in corresponding negatives together with the calculated density differences are listed in the following Table 1. The positive % dot value is transformed in negative % dot value by the equation: 100 − positive % dot value = negative % dot value.

TABLE 1

| | Positive % dot value | Positive integral density | Negative integral density |
|---|---|---|---|
| Cyan Separation Image | | | |
| Isolation area | 25 | 0.125 | 0.602 |
| Background area | 33 | 0.174 | 0.482 |

TABLE 1-continued

|  | Positive % dot value | Positive integral density | Negative integral density |
|---|---|---|---|
| Integral density difference |  | 0.049 | 0.120 |
| Magenta Separation Image |  |  |  |
| Isolation area | 32 | 0.168 | 0.495 |
| Background area | 23 | 0.114 | 0.638 |
| Integral density difference |  | 0.054 | 0.143 |
| Yellow Separation Image |  |  |  |
| Isolation area | 17 | 0.081 | 0.770 |
| Background area | 34 | 0.187 | 0.456 |
| Integral density difference |  | 0.106 | 0.314 |

As can be derived from said integral density differences values the integral density difference between isolation area and background area is the largest in the negative halftone yellow printer separation, viz.: 0.314. To reach, and even surpass, the numeral value of the exposure range of 0.48 as illustrated in FIG. 1 of the applied negative working mask film an overlay combination in register of two of said same negative halftone yellow printer separations (0.314+0.314) was taken to expose therethrough the mask film. With that combination a mask with very good isolation of the desired transparent area from the "opaque" background area was obtained. A negative working mask film was chosen because therewith the lowest density in the area to be isolated as transparent area was obtained.

In the exposure the negative halftone yellow printer separations were used in registering overlaying relation together with an intercalated diffusion foil being a mat resin film having a thickness of 70 μm and a diffuse density of 0.18.

The used mask film was a negative working silver halide room light film sold under the name PRINTON DL 511p. PRINTON is a registered trade name of Agfa-Gevaert N. V. Belgium. Said room light film is characterized by a gradation curve as presented in FIG. 1 which curve was obtained by exposing said film through a continuous tone wedge and developing under the same conditions as employed the production of the mask.

The exposure of said room light film through the sandwich comprising two of said negative halftone yellow printer separations was carried out in a contact exposure apparatus PRINTON CDL 1501 (PRINTON is a registered tradename), said apparatus being provided with a 1000 W halogen-metal lamp. The exposure for optimal mask formation producing in the transparent area an optical density not higher than 0.1 lasted 100.4 seconds.

The development was carried out at 38° C. in a rapid access developer on the basis of hydroquinone and PHENIDON (registered trade name) having a pH of 10.5.

The obtained mask density measured in the developed mask film in the relatively transparent isolation area was 0.1 and in the relatively opaque background area was 2.63. The use of only one halftone yellow printer separation in the exposure yielded the density values 0.1 and 0.91 respectively, which demonstrates the improvement in contrast between transparent and opaque areas in the mask by the use in the exposure of the mask film of two of the same halftone yellow printer separation images.

EXAMPLE 2

From a multicolour transparency in the usual way positive halftone separation images corresponding with the cyan, magenta and yellow image content (halftone cyan printer, halftone magenta printer and halftone yellow printer images) were made. On the basis of a colour proof prepared therewith according to a wash-off technique described in U.S. Pat. No. 4,701,401 a particular area, called herein isolation area, was selected for dot size enlargement. In each of the obtained halftone selection images in that isolation area and in a particular background area the integral density was measured and expressed in % dot value. The obtained integral density measurement values in the positives and the therefrom derived integral density values in corresponding negatives together with the calculated density differences are listed in the following Table 2. The positive % dot value is transformed into negative % dot value by the equation: 100 −positive % dot value= negative % dot value.

TABLE 2

|  | Positive % dot value | Positive integral density | Negative integral density |
|---|---|---|---|
| Cyan Separation Image |  |  |  |
| Isolation area | 30 | 0.155 | 0.523 |
| Background area | 20 | 0.097 | 0.699 |
| Integral density difference |  | 0.058 | 0.176 |
| Magenta Separation Image |  |  |  |
| Isolation area | 45 | 0.260 | 0.347 |
| Background area | 43 | 0.244 | 0.366 |
| Integral density difference |  | 0.016 | 0.019 |
| Yellow Separation Image |  |  |  |
| Isolation area | 55 | 0.347 | 0.260 |
| Background | 53 | 0.328 | 0.276 |
| Integral density difference |  | 0.019 | 0.018 |

As can be observed from said values the integral density difference between isolation area and background area is the highest in the negative halftone cyan printer separation which difference is: 0.176 being ⅓ of the 0.53 exposure range value of FIG. 2. To improve the contrast between transparent isolation area and opaque background area in the mask said halftone cyan printer separation was taken twice to built a sandwich through which the mask film was exposed.

The negative halftone cyan printer separations were used in registering overlaying relation together with an intercalated diffusion foil being a mat resin film having a thickness of 70 μm and a diffuse density of 0.18.

The copy of said overlaying relation was made on a mask film which was a direct positive working silver halide room light film sold under the name PRINTON DLD. PRINTON is a registered trade name of Agfa-Gevaert N. V. Belgium. Said room light film is characterized by a gradation curve as presented in FIG. 2 which curve is obtained by exposing said film through a continuous tone wedge and developing it under the same conditions employed as applied in the development of the mask.

The exposure of said room light film through said sandwich of two negative halftone cyan printer separations was carried out in a contact exposure apparatus PRINTON CDL 1501 (PRINTON is a registered tradename), said apparatus being provided with a 1000

W halogen-metal lamp. The exposure for optimal mask formation lasted 482.6 seconds.

The development was carried out at 38° C. in a rapid access developer constituted of hydroquinone and PHENIDON (registered trade name) and having a pH of 10.5.

The obtained mask density measured in the developed mask film in the relatively transparent isolation area was 0.1 and in the relatively opaque background area was 1.02. The use of a single halftone cyan printer separation yielded the density values 0.1 and 0.38 respectively proving the improvement obtained by the use of two of the same halftone cyan printer separation images in producing the mask.

A mask having an optical density of 1.02 may be considered as being insufficiently opaque in the light-blocking areas and therefore a sandwich of two of said masks gives improved results when applied in the exposure carried out in the process for dry dot etching.

EXAMPLE 3

From a multicolour transparency in the usual way positive halftone separation images corresponding with the cyan, magenta and yellow image content (halftone cyan printer, halftone magenta printer and halftone yellow printer images) were made. On the basis of a colour proof prepared therewith according to a wash-off technique described in U.S. Pat. No. 4,701,401 a particular area, called herein isolation area, was selected for dot size enlargement. In each of the obtained halftone selection images in only one isolation area (I) and in two particular background areas (B1 and B2) the integral density was measured and expressed in % dot value. The obtained results are listed in the following Table 3. The positive % dot value is transformed into negative % dot value by the equation : 100 − positive % dot value = negative % dot value.

TABLE 3

|  | Positive % dot value | Positive integral density | Negative integral density |
| --- | --- | --- | --- |
| Cyan Separation Image |  |  |  |
| Isolation area (I) | 55 | 0.347 | 0.260 |
| Background area 1 (B1) | 7 | 0.032 | 1.155 |
| Background area 2 (B2) | 93 | 1.155 | 0.032 |
| I-B1 |  | +0.315 | −0.895 |
| I-B2 |  | −0.808 | +0.228 |
| Algebraic sum of integral density differences |  | −0.493 | −0.667 |
| Magenta Separaton Image |  |  |  |
| Isolation area (I) | 55 | 0.347 | 0.260 |
| Background area 1 (B1) | 54 | 0.337 | 0.268 |
| Background area 2 (B2) | 56 | 0.357 | 0.252 |
| I-B1 |  | +0.010 | −0.008 |
| I-B2 |  | −0.010 | +0.008 |
| Algebraic sum of integral density differences |  | 0 | 0 |
| Yellow Separation Image |  |  |  |
| Isolation area (I) | 33 | 0.174 | 0.482 |
| Background area 1 (B1) | 34 | 0.181 | 0.468 |
| Background area 2 (B2) | 32 | 0.168 | 0.495 |
| I-B1 |  | −0.007 | +0.014 |
| I-B2 |  | +0.006 | −0.013 |
| Algebraic sum of integral density differences |  | −0.001 | +0.001 |

As can be seen from the algebraic sum values of the integral density differences between said one isolation area and said two background areas the largest absolute value corresponds with the negative halftone cyan printer separation. On using said single negative halftone cyan printer separation in the exposure of a positive working mask film the obtained result shows that there is a sufficient opaqueness in the background area 1 but that the background area 2 is still too transparent with respect to the isolation area (I). In order to remedy that deficiency the negative halftone cyan printer separation was combined with the positive halftone cyan printer separation which combination represents the largest density difference between isolation area (I) and background area B2, (I=B2) of said combination is −0.580. Indeed, the algebraic sum of the integral density difference (I−B2) corresponds with −0.808+0.228=−0.580 so that the overlay combination of the positive cyan printer separation and negative cyan printer separation respectively is in absolute value larger than 0.53 which is the defined exposure range of the positive working silver halide emulsion film, PRINTON DLD 510p (PRINTON is a registered trade name) the gradation curve of which is given in FIG. 2.

Through said combination of separation images the mask film was exposed yielding a mask with very good isolation of the "transparent" isolation area from the "opaque" background areas.

The negative and positive halftone cyan printer separations were used in registering overlaying relation together with an intercalated diffusion foil being a mat resin film having a thickness of 70 μm and a diffuse density of 0.18.

The exposure of said room light film through said sandwich of the negative and positive halftone cyan printer separations was carried out in a contact exposure apparatus PRINTON CDL 1501 (PRINTON is a registered tradename), said apparatus being provided with a 1000 W halogen-metal lamp. The exposure for optimal mask formation lasted 73.1 seconds.

The development was carried out at 38° C. in a rapid access developer of hydroquinone and PHENIDON (registered trade name) having a pH of 10.5.

The optical density obtained in the mask in the relatively transparent isolated area was 0.1 and in the background areas 1 and 2 was 2.13 and 1.93 respectively.

EXAMPLE 4

From a multicolour transparency in the usual way positive halftone separation images corresponding with the cyan, magenta and yellow image content (halftone cyan printer, halftone magenta printer and halftone yellow printer images) were made. On the basis of a colour proof prepared therewith according to a wash-off technique described in U.S. Pat. No. 4,701,401 particular areas, called herein isolation areas, were selected for dot size enlargement. In each of the obtained halftone separation images in three isolation areas and in two particular background areas the integral density was measured and expressed in % dot value. The obtained results are listed in the following Table 4.

TABLE 4

| Positive Separation image | % dot values | | | |
| --- | --- | --- | --- | --- |
|  | Cyan | Magenta | Yellow | Black |
| Isolation area 1 | 14 | 14 | 12 | 12 |
| Isolation area 2 | 46 | 33 | 34 | 33 |
| Isolation area 3 | 47 | 45 | 26 | 23 |
| Background area 1 | 77 | 75 | 76 | 16 |

TABLE 4-continued

| Positive | % dot values | | | |
|---|---|---|---|---|
| Separation image | Cyan | Magenta | Yellow | Black |
| Background area 2 | 88 | 57 | 75 | 22 |

Using the integrated density values corresponding with said % dot values in a software algorithm for computer the respective density differences between the several isolation area (1, 2 and 3) and the several background area (1 and 2) were computed and compared for each separation image (negative and positive). On the basis of the comparison of the algebraic sums of said differences to find an absolute value surpassing the value of the exposure range value 0.53 of the mask film, the conclusion was reached that by combining the positive halftone cyan printer separation with the positive halftone magenta printer separation a mask with desired isolation (desired contrast difference higher than 0.45) of all the "transparent" isolation areas with respect to all the "opaque" background areas was obtained.

The positive halftone cyan printer separation and the positive halftone magenta printer separation were used in registering overlaying relation together with intercalated diffusion foils being a mat resin film having a thickness of 70 μm and a diffuse density of 0.18.

In the formation of the mask a direct positive working silver halide room light film sold under the name PRINTON DLD (PRINTON is a registered trade name of Agfa-Gevaert N. V. Belgium) was used. Said room light film is characterized by a gradation curve as presented in FIG. 2 which curve is obtained by exposing said film through a continuous tone wedge and developing under the same conditions as the mask.

The exposure of said room light film through said sandwich of separations was carried out in a contact exposure apparatus PRINTON CDL 1501 (PRINTON is a registered tradename), said apparatus being provided with a 1000 W halogen-metal lamp. The exposure for optimal mask formation lasted 61.5 seconds.

The development was carried out at 38° C. in a rapid access developer of hydroquinone and PHENIDON (registered trade name) having a pH of 10.5.

The optical density obtained in the mask in all the relatively transparent isolated area was 0.1 and in the background areas 1 and 2 was respectively 2.08 and 2.33.

EXAMPLE 5

In the present Example 5 only one integral density measurement expressed as % dot value was made in one background area of each halftone colour separation image (cyan, magenta and yellow) and by visual assessment in said halftone separations % dot values of different relatively pure colour areas to be isolated together with clearly identifyable lightness areas to be isolated were taken from Table A given above in the description and transformed into integral density values as given hereinafter.

The obtained measurement and visual assessment results are listed in the following Table 5.

TABLE 5

| Positive | measured % dot values | | | Integral density of |
|---|---|---|---|---|
| Separation image | Cyan | Magenta | Yellow | C+, Y+ and M− |
| Background area (magenta) | 16 | 67 | 19 | 0.61 |
| Isolation areas having colours | | | green | 3.41 |
| | | | cyan | 2.40 |
| and ligthness as mentioned in Table A except for magenta | | | blue | 1.40 |
| | | | red | 1.40 |
| | | | yellow | 2.40 |
| | | | high-light | 1.40 |
| | | | mid.-tone | 1.26 |
| | | | shadow | 2.40 |

C+ stands for positive cyan printer separation image.
Y+ stands for postive yellow printer separation image, and
M− stands for negative magenta printer separation image.

Resorting to the algorithm to find the largest sum of integral density differences between the one background area and the several isolation areas in the different halftone separation images (negative and positive cyan, magenta and yellow printer images), it was found that by combining the positive halftone cyan printer separation with the positive halftone yellow printer separation and the negative magenta printer separation in making an overlay in registration for exposing therethrough the mask film PRINTON DLD (PRINTON is a registered trade mark) the most contrasty isolation of said one background area from all of the isolation area was obtained.

Said sum of differences was high enough to reach an absolute value surpassing the numeral value of the exposure range of the applied mask film, viz. 0.53.

In the exposure said separation images were used in register overlay together with intercalated diffusion foils being mat resin films having a thickness of 70 μm and a diffuse density of 0.18.

The exposure of said room light film through said overlay in registration of said separations was carried out in a contact exposure apparatus PRINTON CDL 1501 (PRINTON is a registered tradename), said apparatus being provided with a 1000 W halogen-metal lamp. The exposure for optimal mask formation lasted 17.3 seconds.

The development was carried out at 38° C. in a rapid access developer of hydroquinone and PHENIDON (registered trade name) having a pH of 10.5.

The optical density obtained in the mask in the different relatively transparent background areas was 0.1 and in said one background area was 2.83.

We claim:

1. In a process for the production of photographic masks for tonal correction by dry dot etching, which process comprises the steps of:
   (1) contact exposing a silver halide emulsion mask film, behind at least one black-and-white halftone colour separation reproduction in accurate overlaying registering relation, in combination with at least one light-diffusion sheet to produce a mask film in which at least one transparent area is free from dot structure, and
   (2) photographically developing the thus exposed mask film, the improvement wherein said at least one colour separation reproduction is produced by the steps comprising:
      (i) in different halftone separation images selected from the group consisting of negative and positive cyan, magenta, yellow and optionally black printer separation images, of the same multicolour original, measuring the integral optical density in at least one area to be isolated as a substantially transparent area in the mask film for purposes of correction or modification in dot size, and also in at least one particular background area associated with such isolation area, (ii) calculating the difference between the integral optical density measured in each of said areas to be isolated and the integral density measured in said at least one particular background area, (iii) comparing the density difference values obtained in each halftone colour separation image between at least one such area to be isolated and said at least one particular background area either directly or in the form of the algebraic sum of the density differences obtained between at least one such area to be isolated and said at least one particular background area in order to identify at least one halftone colour separation image corresponding with the largest absolute value of said density differences or of the algebraic sum of such density differences, and (iv) utilizing the thus identified at least one halftone colour separation image in the exposure of step (1) above, provided that said direct density difference or algebraic sum of density differences corresponding with the identified at least one halftone separation image is at least equal in numerical value to ⅓ the numeral value of the relative log exposure value range corresponding with the optical density range value between optical density 0.1 and 1.8 in the gradation curve plotting optical density (D) versus relative log exposure (re. log E) curve, that is obtained by exposure of said mask film through a continuous tone wedge and photographic development thereof under the conditions used in the above step (2).

2. Process according to claim 1, wherein the numeral value of said direct density difference or algebraic sum of density differences is at least equal to the numeral value of said exposure range.

3. Process according to claim 1, wherein the mask film is a negative working silver halide emulsion film for which the exposure range is 0.48.

4. Process according to claim 1, wherein the mask film is a positive working silver halide emulsion film for which the exposure range is 0.53.

5. Process according to claim 1, wherein the colour of the said at least one area to be isolated the colour of each such background area and their lightness values are not identified by measurement but by visual assessment of the % dot values in the different halftone colour separation images corresponding to cyan, magenta and yellow and optionally black to obtain the corresponding integral density values for calculating said density differences, provided at least one integrated density measurement is carried out in either an area to be isolated or in a background area.

6. Process according to claim 1, wherein the identification of said at least one halftone colour separation is determined by a programmed computer.

7. Process according to claim 6, wherein the computations of said density differences, their algebraic sum and comparison thereof to find said highest absolute value are carried out by means of a programmed electronic computer operating in conjunction with a data memory device.

8. Process according to claim 1, wherein said at least one halftone separation image used in the exposure of the mask film yields a mask wherein each opaque background area has an optical density of at 1.8 and a density difference between each transparent isolation area and each such opaque background area is at least 0.45.

9. Process according to claim 1, wherein the optical density of each transparent area is not higher than 0.1.

10. Process according to claim 1, wherein the halftone separation image having the largest density difference between said area to be isolated and at least one particular background area is duplicated and is used in dual form in overlaying registering sandwiched relation for the exposure therethrough of the mask film.

11. The process according to claim 1 wherein a combination of halftone separations giving the highest absolute value of density difference, calculated as an algebraic sum, is used in overlaying registering sandwiched relation for the exposure therethrough of the mask film 12. The process of claim 11 wherein said combination is of positive and/or negative halftone separations.

* * * * *

UNITED STATES PATENT AND TRADEMARK OFFICE
CERTIFICATE OF CORRECTION

PATENT NO. : 4,997,733

DATED : March 5, 1991

INVENTOR(S) : Louis N. Carleer, Pierre H. Nys, Rudy F. Soetens

It is certified that error appears in the above-identified patent and that said Letters Patent is hereby corrected as shown below:

Column 16, line 27, after "at insert--least--.

Signed and Sealed this

Twenty-third Day of June, 1992

Attest:

DOUGLAS B. COMER

*Attesting Officer*   Acting Commissioner of Patents and Trademarks